US011955507B2

United States Patent
Li et al.

(10) Patent No.: US 11,955,507 B2
(45) Date of Patent: Apr. 9, 2024

(54) LIGHT-EMITTING DEVICE AND MANUFACTURING METHOD THEREOF AND MANUFACTURING METHOD OF LIGHT-EMITTING APPARATUS

(71) Applicant: Au Optronics Corporation, Hsinchu (TW)

(72) Inventors: Hsin-Hung Li, Hsinchu (TW); Wei-Syun Wang, Hsinchu (TW); Chih-Chiang Chen, Hsinchu (TW); Yu-Cheng Shih, Hsinchu (TW); Cheng-Chan Wang, Hsinchu (TW); Chia-Hsin Chung, Hsinchu (TW); Ming-Jui Wang, Hsinchu (TW); Sheng-Ming Huang, Hsinchu (TW)

(73) Assignee: AU OPTRONICS CORPORATION, Hsinchu (TW)

( * ) Notice: Subject to any disclaimer, the term of this patent is extended or adjusted under 35 U.S.C. 154(b) by 365 days.

(21) Appl. No.: 17/469,896

(22) Filed: Sep. 9, 2021

(65) Prior Publication Data
US 2022/0375989 A1  Nov. 24, 2022

(30) Foreign Application Priority Data
May 21, 2021 (TW) .................................. 110118441

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/42* (2013.01);
(Continued)

(58) Field of Classification Search
CPC ....... H01L 27/156; H01L 33/42; H01L 33/24; H01L 33/005; H01L 33/0075;
(Continued)

(56) References Cited

U.S. PATENT DOCUMENTS 6,498,048 B2 * 12/2002 Morita ................ H01L 21/0237
438/22
6,627,520 B2 * 9/2003 Kozaki ............... H01L 21/0242
438/479

(Continued)

FOREIGN PATENT DOCUMENTS

| CN | 101661988 | 3/2010 |
|---|---|---|
| CN | 104681672 | 2/2018 |

(Continued)

*Primary Examiner* — Savitri Mulpuri
(74) *Attorney, Agent, or Firm* — JCIPRNET

(57) ABSTRACT

A light-emitting device, including a first type semiconductor layer, a patterned insulating layer, a light-emitting layer, and a second type semiconductor layer, is provided. The patterned insulating layer covers the first type semiconductor layer and has a plurality of insulating openings. The insulating openings are separated from each other. The light-emitting layer is located in the plurality of insulating openings and covers a portion of the first type semiconductor layer. The second type semiconductor layer is located on the light-emitting layer.

2 Claims, 7 Drawing Sheets

(51) Int. Cl.
*H01L 33/42* (2010.01)
*H01L 33/44* (2010.01)

(52) U.S. Cl.
CPC ...... *H01L 33/44* (2013.01); *H01L 2933/0016* (2013.01); *H01L 2933/0025* (2013.01)

(58) Field of Classification Search
CPC ......... H01L 33/44; H01L 33/08; H01L 33/06; H01L 2933/0016; H01L 33/007; H01L 2933/0025; H01L 33/32
See application file for complete search history.

(56) References Cited

U.S. PATENT DOCUMENTS

| | | | |
|---|---|---|---|
| 7,723,737 B2 * | 5/2010 | Lee | H01L 27/153 |
| | | | 257/E33.068 |
| 11,145,786 B2 * | 10/2021 | Henry | H01L 33/06 |
| 11,374,147 B2 * | 6/2022 | Charles | H01L 33/0093 |
| 2008/0079013 A1 | 4/2008 | Li et al. | |
| 2012/0007042 A1 | 1/2012 | Hsieh et al. | |
| 2021/0119080 A1 * | 4/2021 | Chen | H01L 27/15 |

FOREIGN PATENT DOCUMENTS

| | | |
|---|---|---|
| JP | 5584331 | 9/2014 |
| TW | 200727513 | 7/2007 |
| TW | 202032808 | 9/2020 |
| WO | 2021013641 | 1/2021 |

\* cited by examiner

LIGHT-EMITTING DEVICE AND MANUFACTURING METHOD THEREOF AND MANUFACTURING METHOD OF LIGHT-EMITTING APPARATUS

CROSS-REFERENCE TO RELATED APPLICATION

This application claims the priority benefit of Taiwan application serial no. 110118441, filed on May 21, 2021. The entirety of the above-mentioned patent application is hereby incorporated by reference herein and made a part of this specification.

BACKGROUND

Technical Field

The invention relates to an electronic device and a manufacturing method of the electronic device, and particularly relates to a light-emitting device and a manufacturing method thereof and a manufacturing method of a light-emitting apparatus.

Description of Related Art

Light-emitting diodes (LEDs) have advantages such as long service life, small size, high shock resistance, low heat generation, low power consumption, etc., so that they have been widely used as indicators or light sources of household appliances and various equipment. In recent years, the LEDs have been developed toward multi-color and high-brightness, so that application fields thereof have been extended to large outdoor billboards, traffic lights and related fields. In the future, the LEDs may even become main illumination light sources with both power saving and environmental protection functions.

In a general manufacturing process of LEDs, a light-emitting layer is usually formed by first forming a corresponding light-emitting material layer, and then defining a range of the light-emitting layer by means of etching. However, in the process of etching the light-emitting material layer to form the light-emitting layer, a yield may be decreased due to process factors (such as side etching). Moreover, it is difficult to control the manufacturing process if the light-emitting layer with a smaller size is to be formed.

SUMMARY

The invention is directed to a light-emitting device and a manufacturing method thereof and a manufacturing method of a light-emitting apparatus, which have better quality or yield.

The invention provides a light-emitting device including a first type semiconductor layer, a patterned insulating layer, a light-emitting layer, and a second type semiconductor layer. The patterned insulating layer covers the first type semiconductor layer and has a plurality of insulating openings. The insulating openings are separated from each other. The light-emitting layer is located in the plurality of insulating openings and covers a part of the first type semiconductor layer. The second type semiconductor layer is located on the light-emitting layer.

The invention provides a manufacturing method of a light-emitting device including the following steps. A first type semiconductor layer is formed on a substrate. An insulating layer is formed on the first type semiconductor layer. The insulating layer has a plurality of insulating openings exposing a portion of the first type semiconductor layer. A light-emitting layer is formed in the plurality of insulating openings to cover a portion of the first type semiconductor layer. A second type semiconductor layer is formed on the light-emitting layer.

The invention provides a manufacturing method of a light-emitting apparatus including the following steps. A first light-emitting device is formed by a substrate. The first light-emitting device includes a first type semiconductor layer, a patterned insulating layer, a first light-emitting layer, and a second type semiconductor layer. The patterned insulating layer covers the first type semiconductor layer and has a plurality of first insulating openings. The first insulating openings are separated from each other. The first light-emitting layer is located in the plurality of first insulating openings and covers a portion of the first type semiconductor layer. The second type semiconductor layer is located on the first light-emitting layer. The first light-emitting device is disposed on a circuit substrate to electrically connect the circuit substrate.

Based on the above description, in the manufacturing method of the light-emitting device, the insulating openings of the patterned insulating layer are formed first, and then the light-emitting layer is formed in the insulating openings. In this way, a manufacturing yield of the light-emitting device is improved, and a quality and yield of the light-emitting apparatus are further improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
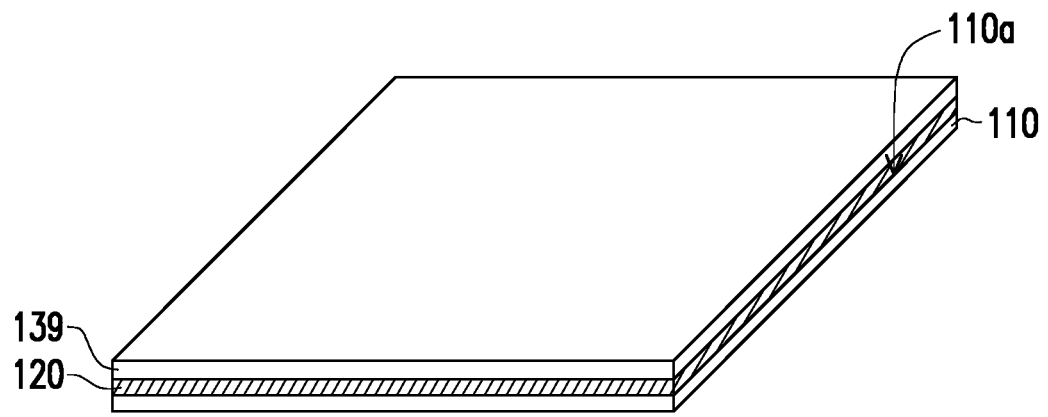
FIG. 1A to FIG. 1G are partial three-dimensional views of a part of a manufacturing method of a light-emitting device according to a first embodiment of the invention.

In order to make the above-mentioned features and advantages of the invention more obvious and understandable, following embodiments are described in detail with reference of accompanying drawings. As those skilled in the art would realize, the described embodiments may be modified in various different ways without departing from the spirit or scope of the invention.

In the drawings, a thickness of each element and the like are exaggerated for clarity's sake. Throughout the specification, the same reference numerals denote the same elements. It should be understood that when an element such as a layer, film, region, or substrate is referred to as being "on", "connected to," or "overlapped with" another element, the element may be directly on or connected to the another element, or intermediate elements may also be provided there between. In contrast, when an element is referred to as being "directly on" or "directly connected to" another element, there are no intermediate elements. As used herein, "connect" may refer to a physical and/or electrical connection.

It should be understood that although the terms "first", "second", "third", etc., may be used herein to describe various elements, components, regions, layers and/or parts, these elements, components, regions, and/or parts should not be limited by these terms. These terms are only used to distinguish one element, component, region, layer or part from another element, component, region, layer or part. Therefore, a "first element", "component", "region", "layer" or "part" described below may be referred to as a second element, component, region, layer or part without departing from the teachings of the specification.

The terminology used herein is for the purpose of describing particular embodiments and is not intended to be limiting of the invention. As used herein, the singular forms "a," "an" and "the" are intended to include the plural forms as well, unless the context clearly indicates otherwise. "or" represents "and/or". The term "and/or" used herein includes any or a combination of one or more of the associated listed items. It will be further understood that the terms "comprises," "comprising," "includes" and/or "including," when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "under" or "bottom" and "above" or "top" may be used for describing a relationship of one element and another element as that shown in figures. It should be noted that the relative terms are intended to include a different orientation of the device besides the orientation shown in the figure. For example, if a device in a figure is flipped over, the element originally described to be located "under" other element is oriented to be located "above" the other element. Therefore, the illustrative term "under" may include orientations of "under" and "on", which is determined by the specific orientation of the figure. Similarly, if a device in a figure is flipped over, the element originally described to be located "below" or "underneath" other element is oriented to be located "on" the other element. Therefore, the illustrative term "under" or "below" may include orientations of "above" and "under".

The terms "about", "substantial" or "approximate" used herein include the related value and an average within an acceptable deviation range for a specific value determined by those skilled in the art, considering a discussed measurement and a specific number of errors related to the measurement (i.e. a limitation of a measuring system). For example, "about" may represent a range within one or a plurality of standard deviations of the related value, or within ±30%, ±20%, ±10%, ±5%.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The exemplary embodiment is described below with reference of a cross-sectional view of a schematic diagram of an idealized embodiment. Therefore, a shape change of the figure serving as a result of manufacturing techniques and/or tolerances may be expected. Therefore, the embodiment of the invention should not be construed as limited to a particular shape of a region as shown herein, but includes a shape deviation caused by manufacturing tolerance. For example, a shown or described flat area may generally have rough and/or non-linear features. Moreover, a shown acute angle may be round. Therefore, a region shown in the figure is essentially schematic, and a shape thereof is not intended to show an accurate shape of the region, and is not intended to limit a range of the claims of the invention.

FIG. 1A to FIG. 1G are partial three-dimensional views of a part of a manufacturing method of a light-emitting device according to a first embodiment of the invention.

Referring to FIG. 1A, a substrate 110 is provided. The substrate 110 may be a gallium arsenide (GaAs) substrate, a gallium phosphide (GaP) substrate, an indium phosphide (InP) substrate, a sapphire substrate, a silicon carbide (SiC) substrate, or a gallium nitride (GaN) substrate, and it is suitable to form a corresponding film layer (such as a semiconductor material layer, a conductive material layer, an insulating material layer and/or a photoresist layer, but the invention is not limited thereto) on a surface 110a of the substrate 110.

In an embodiment, the surface 110a of the substrate 110 may have other film layers (such as an aluminium nitride (AlN) layer, which may be referred to as a buffer layer, but the invention is not limited thereto), but the invention is not limited thereto.

It should be noted that FIG. 1A only illustrates a corresponding region in the substrate 110 (for example, a quadrangular region shown in FIG. 1A). In other words, the invention does not limit the shape of the substrate 110. In addition, in other unshown regions on the substrate 110, the same or similar manufacturing processes as described later may be performed.

Continuing to refer to FIG. 1A, a first type semiconductor layer 120 is formed on the surface 110a of the substrate 110. In an embodiment, the first type semiconductor layer 120 may be formed by, for example, a metal-organic chemical vapor deposition (MOCVD) method, but the invention is not limited thereto.

In the embodiment, the first type semiconductor layer 120 may comprehensively cover the surface 110a of the substrate 110.

It should be noted that in the invention, "comprehensively cover" or "comprehensively form" may be to cover or form a subsequently formed film layer on the substrate 110 and/or on a previously formed film layer by deposition, plating or other suitable methods without a step of patterning. Certainly, in a general semiconductor manufacturing process, the subsequently formed film layer may further partially cover an edge of the substrate 110 and/or previously formed film layer, or it may cause a partial uncovered region due to deposition, plating or similar existing machine parts (such as: a shadow frame used to reduce a side plating or a fixed part used to fix the substrate 110), and the above-mentioned situations may all be included in the definition of "comprehensively cover" or "comprehensively form" of the invention.

In the embodiment, the first type semiconductor layer 120 may be an n-type semiconductor layer, but the invention is not limited thereto. A material of the n-type semiconductor layer is, for example, n-type gallium nitride (n-GaN) doped with group IVA elements (such as silicon), but the invention is not limited thereto. In an embodiment, the first type semiconductor layer 120 may be a p-type semiconductor layer.

Continuing to refer to FIG. 1A, an insulating layer 139 is formed on the first type semiconductor layer 120. In one embodiment, the insulating layer 139 may be formed by, for example, chemical vapor deposition (CVD), but the invention is not limited thereto.

In the embodiment, the insulating layer 139 may be comprehensively formed on the first type semiconductor layer 120.

In the embodiment, a material of the insulating layer 139 may include silicon oxide, silicon nitride, silicon oxynitride, a combination or a stacking thereof, or other similar materials, but the invention is not limited thereto.

Figure 1B:
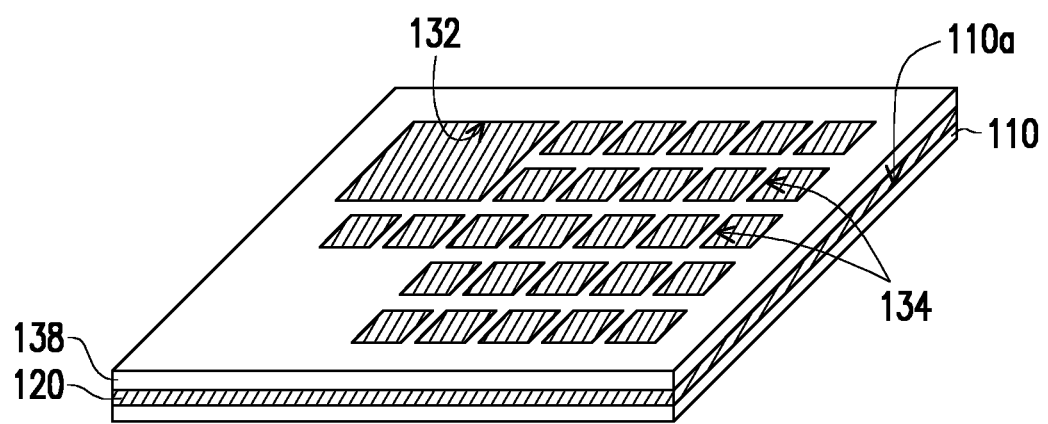

Referring to FIG. 1A to FIG. 1B, through a lithography and etching process, the insulating layer 139 (shown in FIG. 1A) may be formed into an insulating layer 138 (shown in FIG. 1B) having a plurality of openings (such as openings 132 or openings 134, but the invention is not limited thereto; for simplicity's sake, in the subsequent description of the embodiment, only the openings 132 or the openings 134 are schematically indicated). For example, the insulating layer 138 has a first electrode opening 132 and a plurality of insulating openings 134 exposing the first type semiconductor layer 120. In FIG. 1B, only one first electrode opening 132 is exemplarily shown, but the invention is not limited thereto. In addition, for clarity's sake, not all of the insulating openings 134 are indicated one by one in FIG. 1B.

The openings 132, 134 of the insulating layer 138 are separated from each other. For example, any two of the plurality of insulating openings 134 are separated from each other, and/or any one of the plurality of insulating openings 134 and the first electrode opening 132 are separated from each other.

In the embodiment, the openings 132 and 134 of the insulating layer 138 may be formed by wet etching.

Figure 1C:
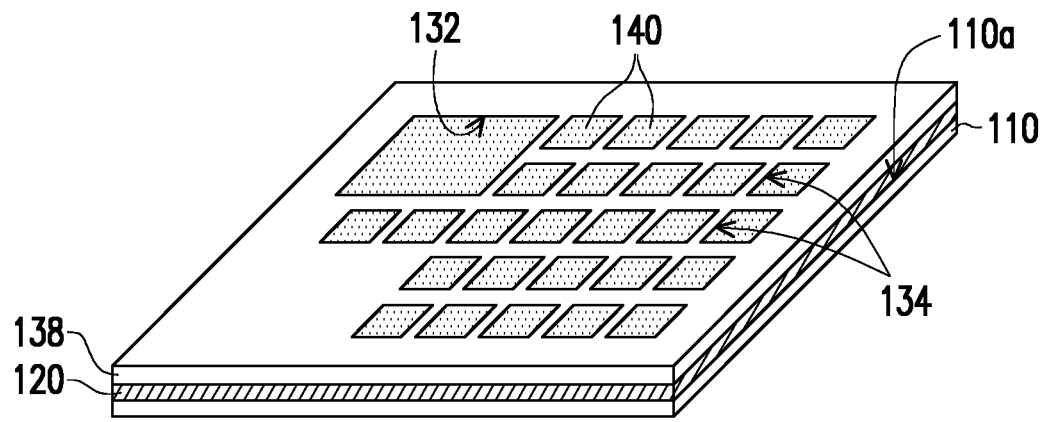
Figure 1D:
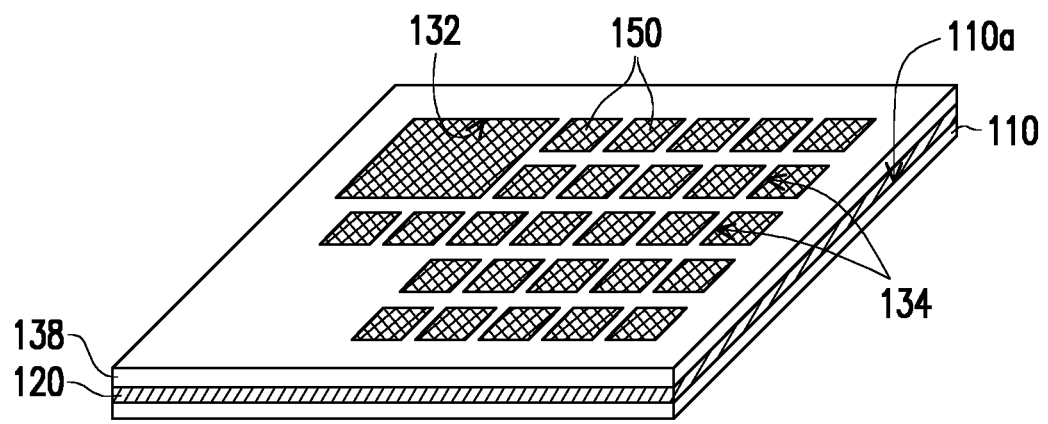
Figure 1E:
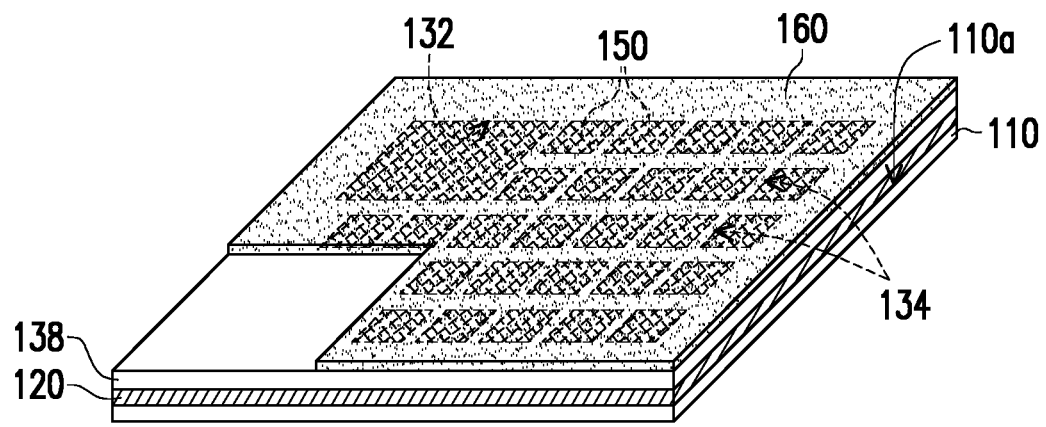
Figure 1F:
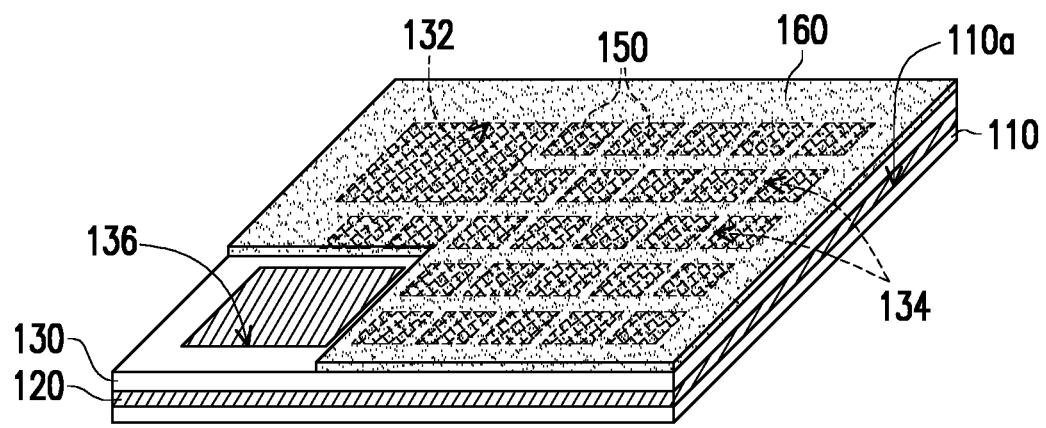
Figure 1G:
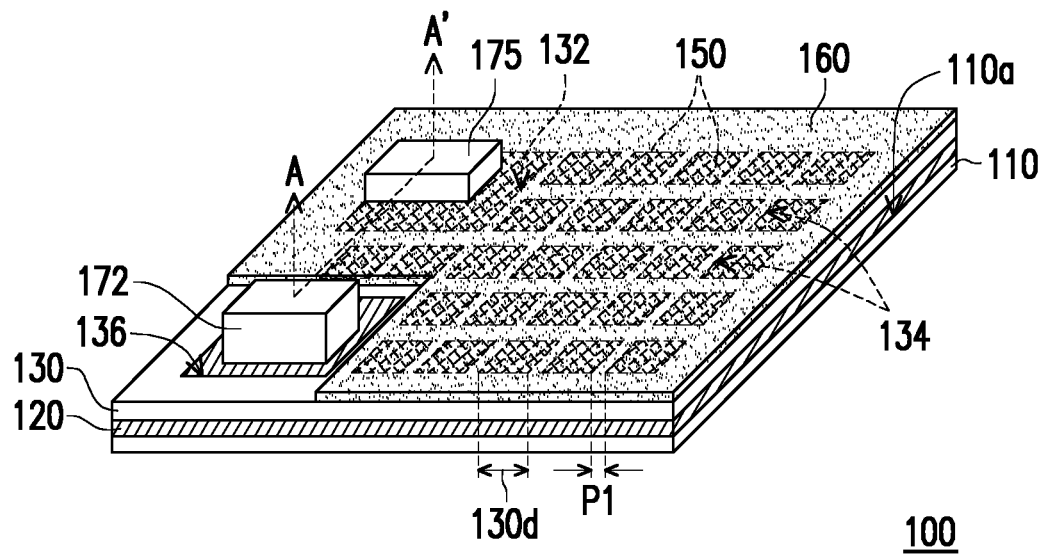
Figure 1H:
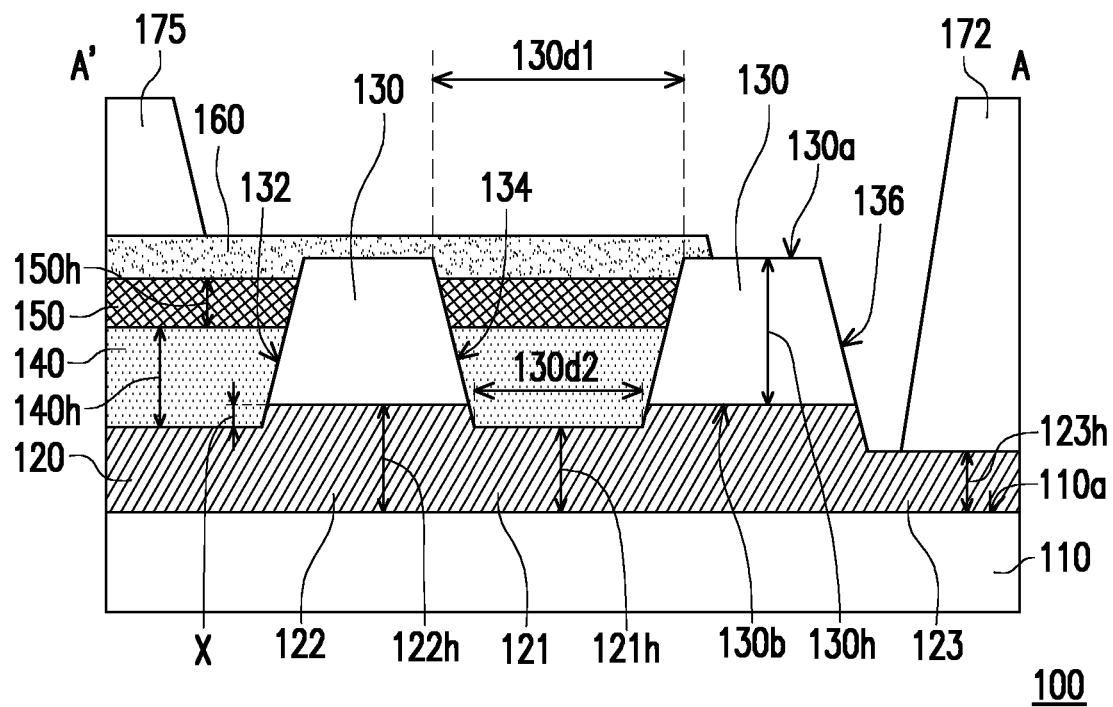
FIG. 1H is a schematic partial cross-sectional view of the light-emitting device according to the first embodiment of the invention.

In an embodiment, a cross section of the openings (such as the openings 132 and 134, but the invention is not limited thereto) formed by wet etching may be the same or similar to an inverted trapezoid (as shown in FIG. 1H).

In an embodiment, when the openings 132 and 134 of the insulating layer 138 are formed by means of wet etching, a portion of the first type semiconductor layer 120 corresponding to the regions of the openings 132 and 134 may also be slightly removed. The above situation may be referred to as an over etching phenomenon. Namely, a thickness of the portion of the first type semiconductor layer 120 corresponding to the openings 132 and 134 will be smaller than or equal to a thickness of the other portion of the first type semiconductor layer 120 overlapped with the insulating layer 138 (as shown in FIG. 1H; but the invention is not limited thereto).

Referring to FIG. 1B to FIG. 1C, a light-emitting layer 140 is formed in at least the insulating openings 134 of the insulating layer 138. In an embodiment, the light-emitting layer 140 may be formed on a portion of the first type semiconductor layer 120 exposed by the insulating openings 134 through, for example, an epitaxial process, but the invention is not limited thereto. In addition, for clarity's sake, not all of the light-emitting layers 140 are indicated one by one in FIG. 1B.

In the embodiment, the light-emitting layer 140 has, for example, a multiple quantum well (MQW) structure. The MQW structure includes a plurality of quantum well layers and a plurality of quantum barrier layers alternately arranged in a repetitive manner. Further, a material of the light-emitting layer 140 includes, for example, alternately stacked multi-layer indium gallium nitride and multi-layer gallium nitride (InGaN/GaN). By designing a proportion of indium or gallium in the light-emitting layer 140, the light-emitting layer 140 may emit light of a specific color.

In an embodiment, during the epitaxial process, a size of the insulating opening 134 may probably affect the proportion of indium or gallium in the light-emitting layer 140. For example, if a depth of the insulating opening 134 (corresponding to the thickness of the insulating layer 138) is about 0.5 μm to 1.0 μm, and a size of the insulating opening 134 is about 300 nm×300 nm to 500 nm×500 nm, a light-emitting color of the formed light-emitting layer 140 may be biased toward green. For another example, if the depth of the insulating opening 134 is about 0.5 μm to 1.0 μm, and the size of the insulating opening 134 is about 500 nm×500 nm to 1,000 nm×1,000 nm, the light-emitting color of the formed light-emitting layer 140 may be biased toward blue. It should be noted that the size of the aforementioned insulating opening 134 is only expressed as a cross-sectional area of the insulating opening 134 on a virtual plane parallel to the surface 110a. In other words, the invention does not limit a cross-sectional shape of the insulating opening 134 on the aforementioned virtual plane. For example, the cross-sectional shape of the insulating opening 134 on the aforementioned virtual plane may be quadrilateral, quadrilateral-like (such as a quadrilateral-like with at least one rounded corner), other similar polygons, polygon-like shapes, possible shapes with arc edges (such as a circle or an ellipse) or other suitable shapes that may be reasonably used to form the corresponding light-emitting layer 140.

In the embodiment, the light-emitting layers 140 located in the insulating openings 134 are separated from each other. In an embodiment, a thickness 140h of the light-emitting layer 140 (indicated in FIG. 1H) may be smaller than the thickness of the insulating layer 138 (for example, the same or similar to a thickness 130h shown in FIG. 1H).

Referring to FIG. 1C to FIG. 1D, a second type semiconductor layer 150 is formed in at least the insulating openings 134 of the insulating layer 138. In an embodiment, the second type semiconductor layer 150 may be formed on the light-emitting layer 140 in the insulating openings 134 (indicated in FIG. 1C) by an epitaxial process, but the invention is not limited thereto.

The type of the second type semiconductor layer 150 is different from the type of the first type semiconductor layer 120. In the embodiment, if the first type semiconductor layer 120 is an n-type semiconductor layer, the second type semiconductor layer 150 may be a p-type semiconductor layer, but the invention is not limited thereto. A material of the p-type semiconductor layer is, for example, p-type gallium nitride (p-GaN) doped with group IIA elements (such as magnesium). In an embodiment, if the first type semiconductor layer 120 is a p-type semiconductor layer, the first type semiconductor layer 120 may be an n-type semiconductor layer.

In the embodiment, the second type semiconductor layers 150 located in the openings may be separated from each other, but the invention is not limited thereto. In an embodiment, a sum of the thickness 140h of the light-emitting layer 140 (indicated in FIG. 1H) and a thickness 150h of the second type semiconductor layer 150 (indicated in FIG. 1H) may be smaller than a sum of a distance X (indicated in FIG. 1H) between the bottom of the insulating layer 138 (for example, the same or similar to the bottom of the insulating layer 130 in FIG. 1H) and the bottom of the light-emitting layer 140 and a thickness of the insulating layer 138 (for example, the same or similar to the thickness of 130*h* in FIG. 1H) (i.e.: 140*h*+150*h*<X+130*h*), but the invention is not limited thereto. In an embodiment, the sum of the thickness 140*h* of the light-emitting layer 140 (indicated in FIG. 1H) and the thickness 150*h* of the second type semiconductor layer 150 (indicated in FIG. 1H) may be further smaller than the thickness of the insulating layer 138 (for example, the same or similar to the thickness of 130*h* in FIG. 1H) (i.e.: 140*h*+150*h*<130*h*), but the invention is not limited thereto.

Referring to FIG. 1D to FIG. 1E, in the embodiment, a light-transmitting conductive layer 160 may be formed on the insulating layer 138. The light-transmitting conductive layer 160 may be formed by, for example, plating (such as physical vapor deposition (PVD), thermal evaporation or other suitable methods), lithography, and an etching process, but the invention is not limited thereto. The light-transmitting conductive layer 160 may be electrically connected to the second type semiconductor layer 150. A pattern of the light-transmitting conductive layer 160 may be adjusted according to design requirements, which is not limited by the invention.

In the embodiment, a material of the light-transmitting conductive layer 160 may include zinc oxide (ZnO), tin oxide (SnO), indium-zinc oxide (IZO), gallium-zinc oxide (GZO), zinc-tin oxide (ZTO) or indium-tin oxide (ITO) or a combination, doping or stacking thereof, but the invention is not limited thereto.

In the embodiment, the light-transmitting conductive layer 160 may be filled in the insulating openings 134 to contact the second type semiconductor layers 150 in the insulating openings 134. In other words, the second type semiconductor layers 150 located in the insulating opening 134 and separated from each other may be electrically connected to each other through the light-transmitting conductive layer 160.

In the embodiment, the light-transmitting conductive layer 160 may expose a portion of the insulating layer 138.

Referring to FIG. 1E to FIG. 1F, in the embodiment, the insulating layer 138 (shown in FIG. 1E) may form the insulating layer 130 with a second electrode opening 136 (shown in FIG. 1F) through a lithography and etching process. The second electrode opening 136 may expose a portion of the first type semiconductor layer 120. In FIG. 1F, only one first electrode opening 132 is schematically illustrated, but the invention is not limited thereto.

In the embodiment, the second electrode opening 136 of the insulating layer 130 may be formed by wet etching. In an embodiment, when the second electrode opening 136 of the insulating layer 130 is formed by wet etching, a portion of the first type semiconductor layer 120 corresponding to a region of the second electrode opening 136 may also be slightly removed.

In the embodiment, the step of forming the second electrode opening 136 is different from the step of forming the first electrode opening 132/the insulating openings 134. In an embodiment, a thickness of a portion of the first type semiconductor layer 120 corresponding to the first electrode opening 132/the insulating openings 134 may be different from a thickness of another portion of the first type semiconductor layer 120 corresponding to the second electrode opening 136 (shown in FIG. 1H, but the invention is not limited thereto).

It should be noted that in the embodiment, the step of forming the second electrode opening 136 is executed after the step of forming the light-transmitting conductive layer 160, but the invention is not limited thereto.

In an embodiment that is not shown, the step of forming the second electrode opening 136 is after the step of forming the light-emitting layer 140, and a portion of the light-transmitting conductive layer may be located in the second electrode opening 136. In addition, if the above-mentioned method is used, the portion of the light-transmitting conductive layer located in the second electrode opening 136 is electrically separated from the other portion of the light-transmitting conductive layer (such as the light-transmitting conductive layer 160 on the light-emitting layer 140).

Referring to FIG. 1F to FIG. 1G, a first electrode 172 and a second electrode 175 are formed. The first electrode 172 is electrically connected to the first type semiconductor layer 120. The second electrode 175 is electrically connected to the second type semiconductor layer 150.

In an embodiment, the first electrode 172 and/or the second electrode 175 may be formed by plating (such as physical vapor deposition or other suitable methods), a lithography and etching process, but the invention is not limited thereto. In an embodiment, the first electrode 172 and/or the second electrode 175 may be, for example, formed by screen printing.

In the embodiment, a material of the first electrode 172 and/or the second electrode 175 may include silver (Ag), copper (Cu), aluminum (Al), other suitable metals, or a combination, doping, stacking, or alloy thereof, but the invention is not limited thereto.

In the embodiment, the second electrode 175 may correspond to the first electrode opening 132, and/or the first electrode 172 may correspond to the second electrode opening 136, but the invention is not limited thereto.

In the embodiment, the first electrode 172 may directly contact the first type semiconductor layer 120, and/or the second electrode 175 may be electrically connected to the second type semiconductor layer 150 through the light-transmitting conductive layer 160, but the invention is not limited thereto.

In an embodiment that is not shown, the first electrode 172 may be electrically connected to the second type semiconductor layer 150 through the light-transmitting conductive layer located in the second electrode opening 136.

Continuing to refer to FIG. 1G, in the embodiment, after the first electrode 172 and/or the second electrode 175 are formed, cutting, iso-etching or other proper singulation process may be performed on at least the first type semiconductor layer 120 and the insulating layer 130 to form one or a plurality of light-emitting devices 100. It should be noted that after the aforementioned cutting, iso-etching or other proper singulation process is performed, the same or similar component symbols will be used on the light-emitting devices 100.

After the above-mentioned manufacturing processes, fabrication of the light-emitting device 100 of the embodiment may be substantially completed.

Referring to 1G and 1H, the light-emitting device 100 includes the first type semiconductor layer 120, the patterned insulating layer 130, the light-emitting layer 140, and the second type semiconductor layer 150. The patterned insulating layer 130 covers the first type semiconductor layer 120. The patterned insulating layer 130 has a plurality of insulating openings 134 separated from each other. The light-emitting layer 140 is located in the insulating openings 134 and covers a portion of the first type semiconductor layer 120. The second type semiconductor layer 150 is located on the light-emitting layer 140.

In the embodiment, the patterned insulating layer 130 includes an insulating top surface 130*a* and an insulating bottom surface 130b. The insulating bottom surface 130b is opposite to the insulating top surface 130a. The insulating top surface 130a is far away from the first type semiconductor layer 120. Each of the plurality of insulating openings 134 has a top aperture 130d1 on the insulating top surface 130a, each of the plurality of insulating openings 134 has a bottom aperture 130d2 on the insulating bottom surface 130b, and the top aperture 130d1 is greater than or equal to the bottom aperture 130d2.

In the embodiment, the first type semiconductor layer 120 has a first region 121 and a second region 122. In a direction perpendicular to the insulating top surface 130a or the insulating bottom surface 130b, the first region 121 is not overlapped with the patterned insulating layer 130, and the first region 121 is overlapped with the light-emitting layer 140. In the direction perpendicular to the insulating top surface 130a or the insulating bottom surface 130b, the second region 122 is overlapped with the patterned insulating layer 130, and the second region 122 is not overlapped with the light-emitting layer 140. A thickness 121h of the first region 121 is smaller than or equal to a thickness 122h of the second region 122. In an embodiment, the thickness 121h of the first region 121 is smaller than the thickness 122h of the second region 122.

In an embodiment, the second region 122 may be not overlapped with the light-emitting layer 140.

In the embodiment, the second type semiconductor layer 150 does not cover the insulating top surface 130a of the patterned insulating layer 130, but the invention is not limited thereto.

In the embodiment, the light-emitting device 100 may further include the light-transmitting conductive layer 160, the first electrode 172 or the second electrode 175. The light-transmitting conductive layer 160 is located on the second type semiconductor layer 150. The first electrode 172 is electrically connected to the first type semiconductor layer 120. The second electrode 175 is electrically connected to the second type semiconductor layer 150.

In the embodiment, the first type semiconductor layer 120 may further have a third region 123. The third region 123 is not overlapped with the patterned insulating layer 130, the third region 123 is not overlapped with the light-emitting layer 140, and the third region 123 is overlapped with the first electrode 172. A thickness 123h of the third region 123 is smaller than or equal to the thickness 122h of the second region 122. In an embodiment, the thickness 123h of the third region 123 is smaller than the thickness 122h of the second region 122. In an embodiment, the thickness 123h of the third region 123 may be further different from the thickness 121h of the first region 121.

In the embodiment, the light-emitting device 100 may further include the substrate 110. The first type semiconductor layer 120 is located on the substrate 110. In the embodiment, the light-emitting device 100 may be referred to as a mini LED.

In an embodiment that is not shown, a light-emitting device similar to the light-emitting device 100 may not include a substrate similar to the substrate 110. In an embodiment that is not shown, the light-emitting device similar to the light-emitting device 100 may be referred to as a micro LED (μLED).

In the embodiment, an aperture 130d of each insulating opening 134 (for example, the top aperture 130d1 and/or the bottom aperture 130d2) may be between about 100 nm and 2000 nm. In one embodiment, the aperture 130d of each insulating opening 134 (for example, the top aperture 130d1 and/or the bottom aperture 130d2) may be between about 300 nm and 1000 nm.

In the embodiment, a pitch P1 between adjacent insulating openings 134 may be between about 100 nm and 1000 nm. In an embodiment, the pitch P1 between the adjacent plurality of insulating openings 134 may be between about 100 nm and 500 nm.

In the embodiment, the thickness 130h of the patterned insulating layer 130 is between about 0.1 μm and 1.0 μm. In an embodiment, the thickness 130h of the patterned insulating layer 130 is between about 0.5 μm and 1.0 μm.

In the embodiment, in the manufacturing method of the light-emitting device 100, the insulating openings 134 of the patterned insulating layer 130 may be formed first, and then the light-emitting layer 140 is formed in the insulating openings 134. In other words, the light-emitting layer 140 located in the insulating openings 134 is basically not etched. In this way, a manufacturing yield of the light-emitting device 100 may be improved. In addition, a distribution area of the light-emitting layer 140 in the light-emitting device 100 may be further adjusted according to an area of the patterned insulating layer 130 and the number of the corresponding insulating openings 134. In this way, an amount of light emitted by the light-emitting device 100 may also be further adjusted.

Figure 2:
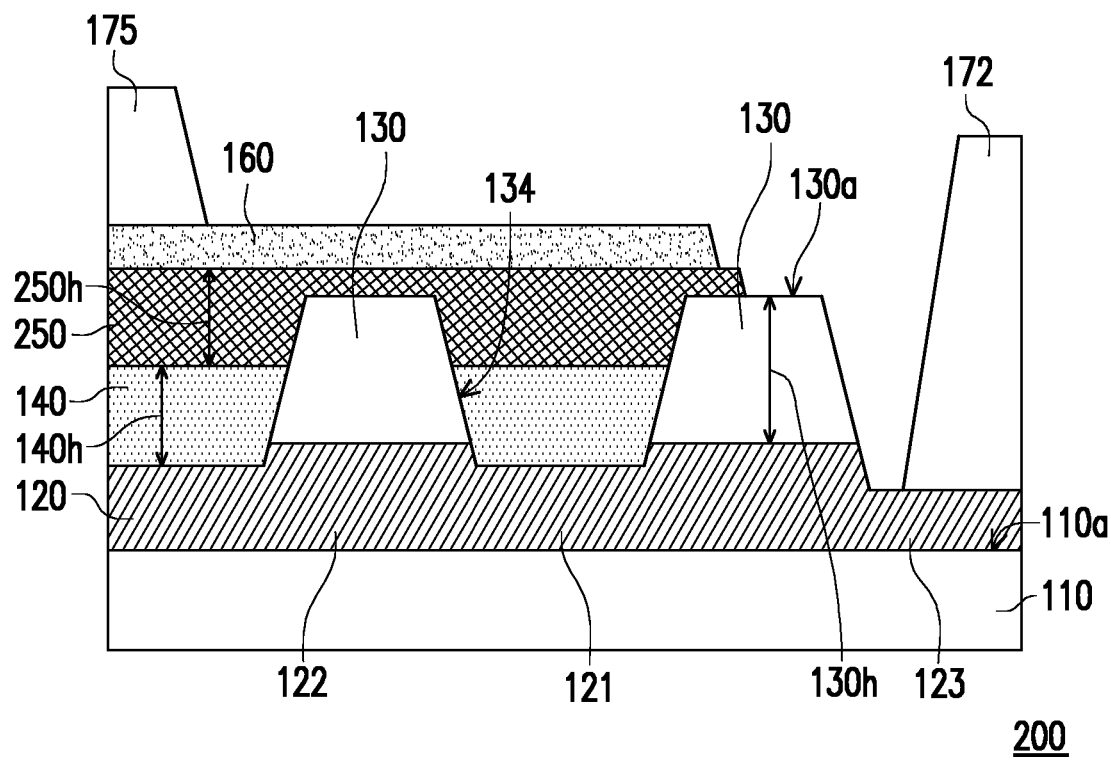
FIG. 2 is a schematic partial cross-sectional view of a light-emitting device according to a second embodiment of the invention.

FIG. 2 is a schematic partial cross-sectional view of a light-emitting device according to a second embodiment of the invention. A manufacturing method of a light-emitting device 200 of the embodiment is similar to the manufacturing method of the light-emitting device 100 of the first embodiment, and similar components are denoted by the same reference numerals, and have similar functions, materials or formation methods, and descriptions thereof are omitted. For example, a position of the cross-section shown in FIG. 2 may be similar to the position of a section line A-A' in FIG. 1G.

Referring to FIG. 2, the light-emitting device 200 may include the first type semiconductor layer 120, the patterned insulating layer 130, the light-emitting layer 140, and a second type semiconductor layer 250. The second type semiconductor layer 250 is located on the light-emitting layer 140. The second type semiconductor layer 250 may further cover the insulating top surface 130a of the patterned insulating layer 130.

In the embodiment, the sum of the thickness 140h of the light-emitting layer 140 and a thickness 250h of the second type semiconductor layer 250 may be greater than the thickness 130h of the insulating layer 130.

Figure 3:
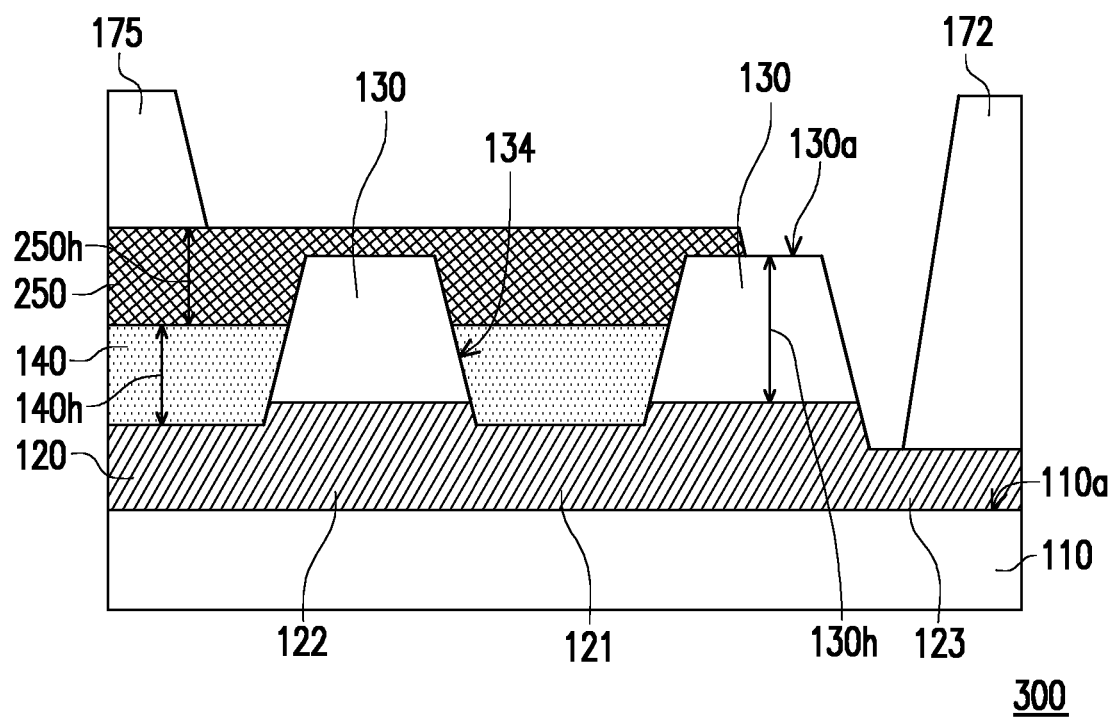
FIG. 3 is a schematic partial cross-sectional view of a light-emitting device according to a third embodiment of the invention.

FIG. 3 is a schematic partial cross-sectional view of a light-emitting device according to a third embodiment of the invention. A manufacturing method of a light-emitting device 300 of the embodiment is similar to the manufacturing method of the light-emitting device 100 or the light-emitting device 200 of the previous embodiment, where similar components are denoted by the same reference numerals, and have similar functions, materials, or formation methods, and descriptions thereof are omitted. For example, a position of the cross-section shown in FIG. 3 may be similar to the position of the section line A-A' in FIG. 1G.

Referring to FIG. 3, the light-emitting device 300 may include the first type semiconductor layer 120, the patterned insulating layer 130, the light-emitting layer 140, the second type semiconductor layer 250, and the second electrode 175. The second electrode 175 may directly contact the second type semiconductor layer 250.

FIG. 4A to FIG. 4D are schematic partial top views of a part of a manufacturing method of a light-emitting apparatus according to an embodiment of the invention.

Figure 4A:
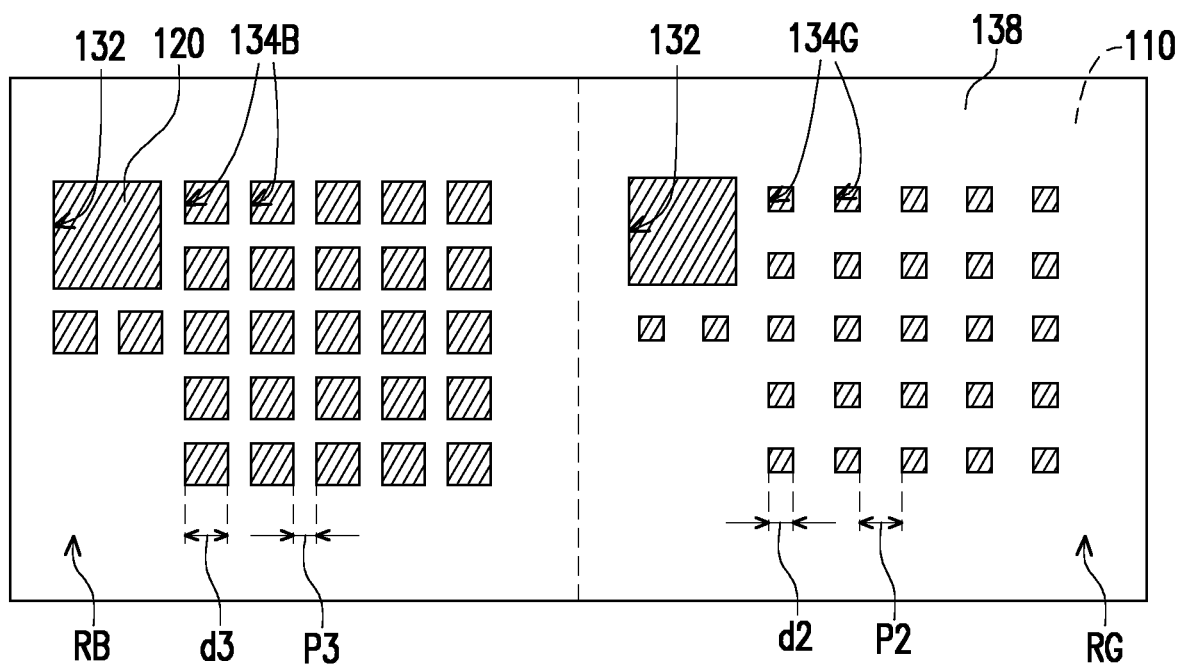
FIG. 4A to FIG. 4D are schematic partial top views of a part of a manufacturing method of a light-emitting apparatus according to an embodiment of the invention.

Referring to FIG. 4A, similar to the step shown in FIG. 1B, the insulating layer 139 (shown in FIG. 1A) may be formed into the insulating layer 138 (shown in FIG. 4A) having a plurality of openings (such as the opening 132, openings 134G, or openings 134B, but the invention is not limited thereto). For example, the insulating layer 138 has a first electrode opening 132 exposing the first type semiconductor layer 120, a plurality of insulating openings 134G, and a plurality of insulating openings 134B. The openings 132, 134G, and 134B of the insulating layer 139 are separated from each other. In addition, for clarity's sake, not all of the insulating openings 134G or all of the insulating openings 134B are indicated one by one in FIG. 4A.

In an embodiment, a pitch P2 between two adjacent first insulating openings 134G may be between about 300 nm and 500 nm, and/or an aperture d2 of the first insulating opening 134G may be between about 300 nm and 500 nm.

In an embodiment, a depth of the first insulating opening 134G is about 0.5 μm to 1.0 μm, and a size of the first insulating opening 134G is about 300 nm×300 nm to 500 nm×500 nm.

In an embodiment, a pitch P3 between two adjacent second insulating openings 134B may be between about 100 nm and 300 nm, and/or an aperture d3 of the second insulating opening 134B may be between about 500 nm and 1000 nm.

In an embodiment, a depth of the second insulating opening 134B is about 0.5 μm to 1.0 μm, and a size of the second insulating opening 134B is about 500 nm×500 nm to 1000 nm×1000 nm.

Continuing to refer to FIG. 4A, a step similar to that shown in FIG. 1C may be used to form a corresponding first light-emitting layer (not directly shown, which may be similar to the aforementioned light-emitting layer 140) and a second light-emitting layer (not directly shown, which may be similar to the aforementioned light-emitting layer 140) on a portion of the first type semiconductor layer 120 exposed by the first insulating openings 134G and the second insulating openings 134B. The first light-emitting layer and the second light-emitting layer may be made of a same material or different materials, which is not limited by the invention.

Figure 4B:
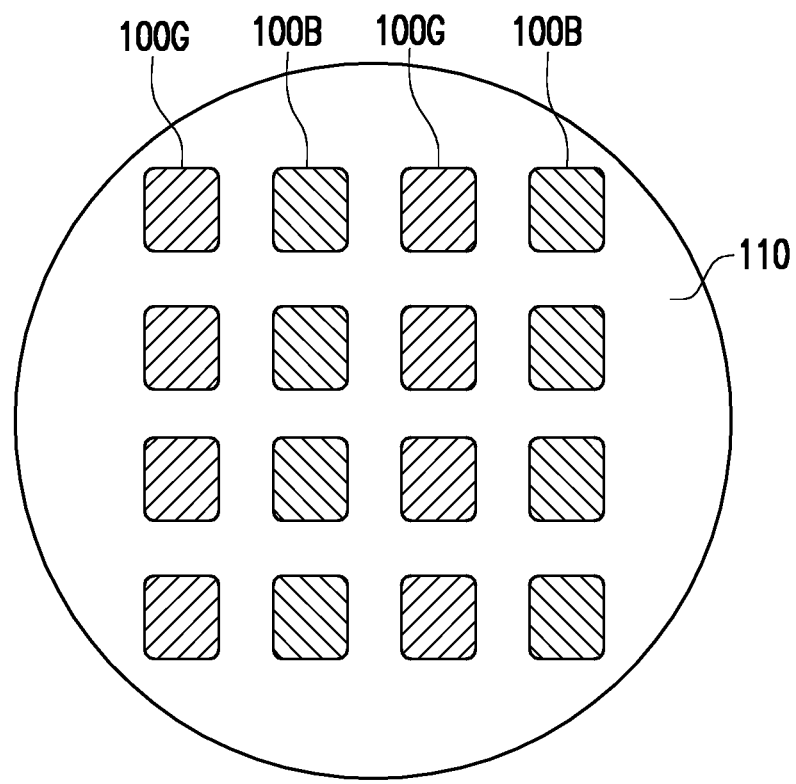

Referring to FIG. 4A to FIG. 4B, steps similar to those in FIG. 1C to 1G may be performed to form a corresponding second type semiconductor layer (not directly shown, which may be similar to the aforementioned second type semiconductor layer 150), a light-transmitting conductive layer (if there is; not directly shown; which may be similar to the aforementioned light-transmitting conductive layer 160), a first electrode (not directly shown; which may be similar to the aforementioned first electrode 172) and a second electrode (not directly shown; which may be similar to the aforementioned second electrode 175). Then, first light-emitting devices 100G and second light-emitting devices 100B may be formed through other suitable manufacturing processes (such as cutting, iso-etching, or other suitable singulation processes). For example, a region RG on the substrate 110 corresponding to the first insulating openings 134G may be correspondingly formed into the first light-emitting devices 100G, and another region RB on the substrate 110 corresponding to the second insulating openings 134B may be correspondingly formed into the second light-emitting devices 100B. Namely, the first light-emitting devices 100G and the second light-emitting devices 100B may be formed from a same substrate (such as the substrate 110). In this way, a manufacturing efficiency of a light-emitting apparatus 400 may be improved. In addition, for clarity's sake, not all of the first light-emitting devices 100G or all of the second light-emitting devices 100B are indicated one by one in FIG. 1B.

Figure 4C:
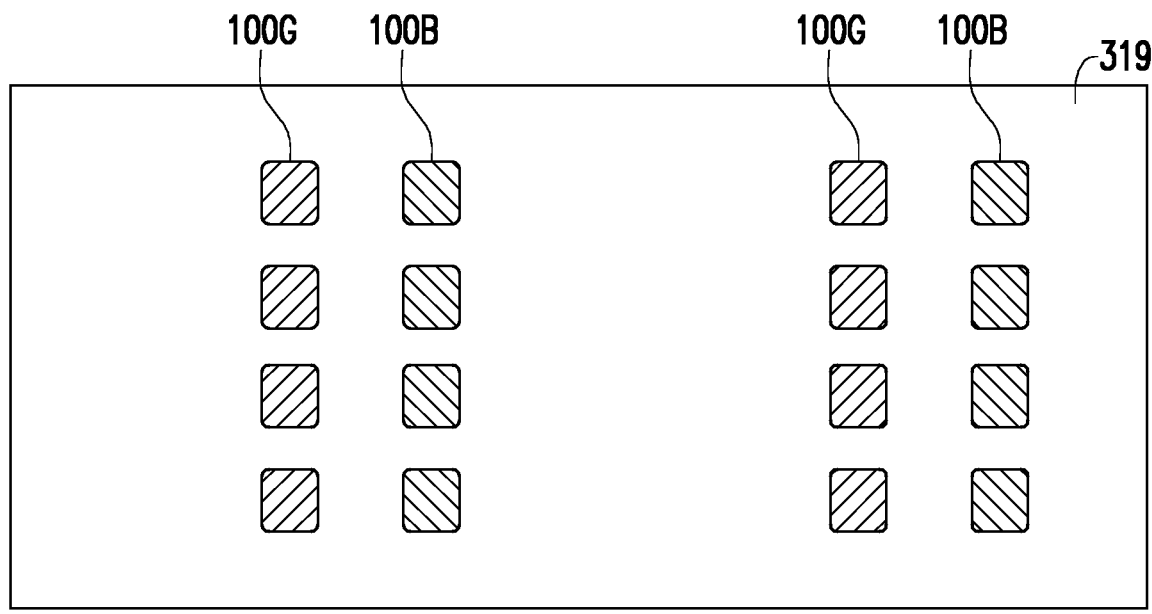

Referring to FIG. 4B to FIG. 4C, the first light-emitting devices 100G and the second light-emitting devices 100B may be transferred to a transfer substrate 319.

Referring to 4C to 4D, the first light-emitting devices 100G and the second light-emitting devices 100B on the transfer substrate 319 may be transferred to a circuit substrate 310. The circuit substrate 310 may have corresponding circuits (for example, circuits including connection pads; but the invention is not limited thereto) or devices (for example, driving devices; but the invention is not limited thereto), and the first light-emitting devices 100G and/or the second light-emitting devices 100B may be electrically connected to the corresponding circuits in the circuit substrate 310.

Figure 4D:
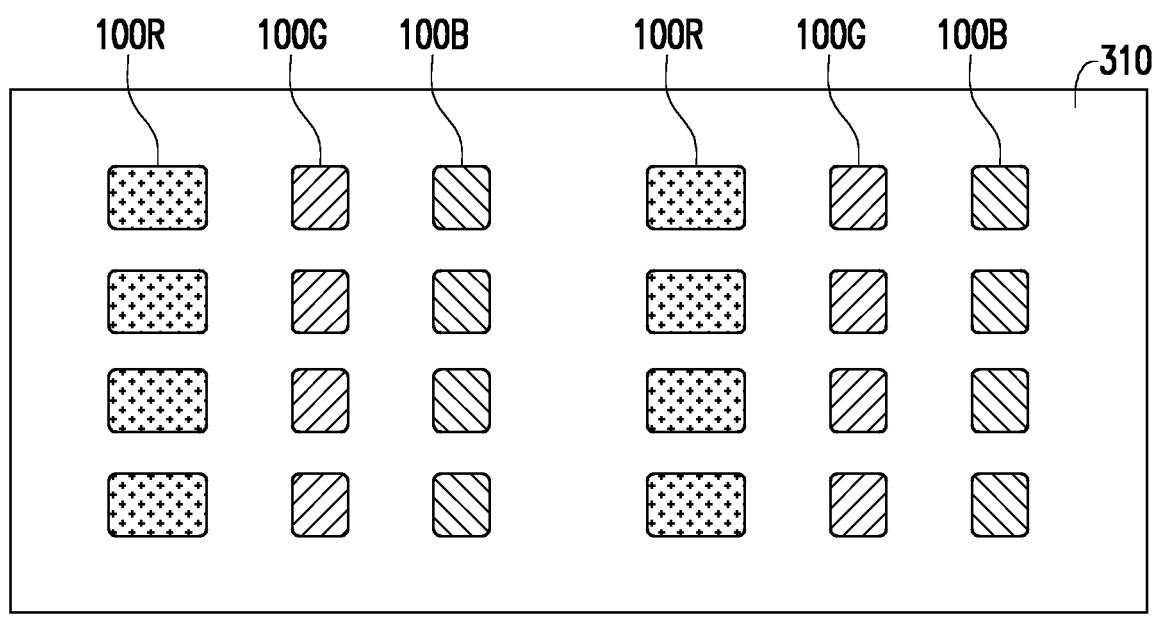

Referring to FIG. 4D, third light-emitting devices 100R may be transferred to the circuit substrate 310. The third light-emitting devices 100R may be electrically connected to the corresponding circuits in the circuit substrate 310.

In an embodiment, the first light-emitting devices 100G and the second light-emitting devices 100B may be transferred to the circuit substrate 310 first, and then the third light-emitting devices 100R are transferred to the circuit substrate 310. In an embodiment, the third light-emitting devices 100R may be transferred to the circuit substrate 310 first, and then the first light-emitting devices 100G and the second light-emitting devices 100B are transferred to the circuit substrate 310.

After the above-mentioned manufacturing process, fabrication of the light-emitting apparatus 400 of the embodiment may be substantially completed. The light-emitting apparatus 400 may include the first light-emitting devices 100G, the second light-emitting devices 100B, and the circuit substrate 310. The manufacturing method of the first light-emitting devices 100G and/or the second light-emitting devices 100B may be the same or similar to the manufacturing method of the light-emitting device 100 in the aforementioned embodiment. In this way, fabrication of the light-emitting apparatus 400 may be relatively simple, and/or the light-emitting apparatus 400 may have better quality or yield.

In the embodiment, the first light-emitting devices 100G may include green light-emitting devices, the second light-emitting devices 100B may include blue light-emitting devices, and/or the third light-emitting device 100R may include red light-emitting devices. A size of the red light-emitting device (such as the third light-emitting device 100R) may be greater than a size of the green light-emitting device (such as the first light-emitting device 100G) and a size of the blue light-emitting device (such as the second light-emitting device 100B).

In summary, in the manufacturing method of the light-emitting device, the insulating openings of the patterned insulating layer are formed first, and then the light-emitting layer is formed in the insulating openings. In this way, a manufacturing yield of the light-emitting device is improved, and a quality and yield of the light-emitting apparatus are further improved.

The invention claimed is:

1. A manufacturing method of a light-emitting apparatus, comprising:
   forming a first light-emitting device by a substrate,
      wherein the first light-emitting device comprises:

a first type semiconductor layer;
a patterned insulating layer, covering the first type semiconductor layer and having a plurality of first insulating openings, wherein the plurality of first insulating openings are separated from each other;
a first light-emitting layer, located in the plurality of first insulating openings and covering a portion of the first type semiconductor layer; and
a second type semiconductor layer, located on the first light-emitting layer; and disposing the first light-emitting device on a circuit substrate to electrically connect the circuit substrate, wherein the manufacturing the method of the light-emitting apparatus, further comprising: forming a second light-emitting device by the substrate, wherein the second light-emitting device comprises: the first type semiconductor layer; the patterned insulating layer, further having a plurality of second insulating openings, wherein the plurality of second insulating openings are separated from each other; a second light-emitting layer, located in the plurality of second insulating openings and covering a portion of the first type semiconductor layer; and the second type semiconductor layer, located on the second light-emitting layer, wherein apertures of the plurality of second insulating openings are different from apertures of the plurality of first insulating openings; and/or a pitch between the adjacent plurality of first insulating openings is different from a pitch between the adjacent plurality of second insulating openings; and disposing the second light-emitting device on the circuit substrate to electrically connect the circuit substrate; and simultaneously transferring the first light-emitting device and the second light-emitting device formed by the substrate to a transfer substrate.

2. A The manufacturing method of the light-emitting apparatus as claimed in claim 1, wherein the first light-emitting device or the second light-emitting device comprises a green light-emitting device or a blue light-emitting device, the manufacturing method further comprising:
disposing a red light-emitting device on the circuit substrate to electrically connect the circuit substrate, wherein a size of the red light-emitting device is greater than a size of the first light-emitting device and a size of the second light-emitting device.

* * * * *